(12) United States Patent
Kobayashi et al.

(10) Patent No.: US 7,867,925 B2
(45) Date of Patent: Jan. 11, 2011

(54) METHOD FOR MANUFACTURING PATTERN FORMED STRUCTURE

(75) Inventors: Hironori Kobayashi, Tokyo (JP);
Yusuke Uno, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 11/100,054

(22) Filed: Apr. 6, 2005

(65) Prior Publication Data

US 2006/0014086 A1    Jan. 19, 2006

(30) Foreign Application Priority Data

Apr. 12, 2004    (JP) .............................. 2004-117162

(51) Int. Cl.
*H01L 21/00*    (2006.01)
(52) U.S. Cl. ............... 438/798; 438/796; 257/E21.027; 257/E21.035
(58) Field of Classification Search ................. 438/535, 438/759, 795–800, 798, 949, FOR. 389, FOR. 439; 430/5, 201, 311, 322; 257/E21.027, E21.035
See application file for complete search history.

(56) References Cited

U.S. PATENT DOCUMENTS

| | | | | |
|---|---|---|---|---|
| 5,068,260 | A * | 11/1991 | Noguchi | 522/31 |
| 5,422,315 | A * | 6/1995 | Kobayashi | 438/453 |
| 5,648,201 | A * | 7/1997 | Dulcey et al. | 430/324 |
| 6,103,452 | A * | 8/2000 | Kakinuma et al. | 430/281.1 |
| 6,329,209 | B1 * | 12/2001 | Wagner et al. | 436/518 |
| 2002/0072139 | A1 * | 6/2002 | Kashiwabara | 438/29 |
| 2002/0121206 | A1 * | 9/2002 | Ooishi | 101/450.1 |
| 2003/0008217 | A1 * | 1/2003 | Kobayashi | 430/5 |
| 2004/0070705 | A1 * | 4/2004 | Kobayashi | 349/106 |
| 2004/0223926 | A1 * | 11/2004 | Kobayashi | 424/63 |

FOREIGN PATENT DOCUMENTS

| | | |
|---|---|---|
| JP | 2001-07492 S | 3/2001 |
| JP | 2004-069918 A | 3/2004 |

* cited by examiner

*Primary Examiner*—Matthew S Smith
*Assistant Examiner*—Quovaunda Jefferson
(74) *Attorney, Agent, or Firm*—Ladas & Parry LLP

(57) ABSTRACT

The main object of the present invention is to provide a method for manufacturing efficiently a pattern formed structure which has a surface having a property-varied pattern and can be used to manufacture a color filter or the like. In order to achieve the object, the present invention provides a method for manufacturing a pattern formed structure, comprising: a patterning substrate preparing process of preparing a patterning substrate having a base material and a property variable layer which is formed on the base material and has a property variable by action of a photocatalyst based on irradiation with energy; and an energy radiating process of arranging a photocatalyst containing layer side substrate having a base body and a photocatalyst containing layer comprising at least the photocatalyst, and the patterning substrate so as to keep a given interval between the photocatalyst containing layer and the property variable layer, and then radiating energy onto the resultant at an intensity of 0.1 to 10 mW/cm$^2$, thereby forming a property variable pattern in which the property of the property variable layer is varied.

14 Claims, 3 Drawing Sheets

METHOD FOR MANUFACTURING PATTERN FORMED STRUCTURE

BACKGROUND OF THE INVENTION

1. Field of the Invention

The present invention relates to a method for manufacturing a pattern formed structure which has, in its surface, a pattern having different properties and can be used for various articles, a typical example of which is a color filter.

2. Description of the Related Art

Recently, with the development of the personal computers, in particular, the development of the portable personal computers, demand for a liquid crystal display, especially a color liquid crystal display tends to be increased. However, the color liquid displays are expensive; therefore, a request that the cost thereof should be reduced has been increasing. In particular, a request that the cost of their color filters, which accounts for a high ratio in the total cost, should be reduced has been raised.

Thus, the present inventors have been investigating a method of using a property variable pattern forming coating solution which contains a photocatalyst and a material having a property variable by action of the photocatalyst based on irradiation with energy to form a photocatalyst containing layer on a base material, and radiating light in a pattern form onto this layer, thereby forming a pattern having varied properties (Japanese Patent Application Laid-Open (JP-A) No. 2001-074928). According to this method, the property of the photocatalyst containing layer is used to make it possible to easily form a functional portion, such as a colored layer.

In the method for manufacturing a pattern formed structure using such a photocatalyst containing layer, for the light radiation to excite the photocatalyst therein, there is used a method of using a high energy lamp, such as a mercury lamp or a metal halide lamp, to radiate energy at a high intensity from the viewpoint of production efficiency and others. In recent years, however, the area of color filters or the like has been required to be made larger. In the method, the area which can be irradiated with energy is narrow, and a further improvement in production efficiency has also been required.

SUMMARY OF THE INVENTION

Thus, it has been desired to provide a method for efficiently manufacturing a pattern formed structure which has a surface having a property-varied pattern and can be used to manufacture a color filter or the like.

The present invention provides a method for manufacturing a pattern formed structure, comprising; a patterning substrate preparing process of preparing a patterning substrate having a base material and a property variable layer which is formed on the base material and has a property variable by action of a photocatalyst based on irradiation with energy; and an energy radiating process of arranging a photocatalyst containing layer side substrate having a base body and a photocatalyst containing layer comprising at least the photocatalyst, and the patterning substrate so as to keep a given interval between the photocatalyst containing layer and the property variable layer, and then radiating energy onto the resultant at an intensity of 0.1 to 10 mW/cm$^2$, thereby forming a property variable pattern in which the property of the property variable layer is varied.

In the invention, the patterning substrate prepared in the patterning substrate preparing process has the property variable layer; therefore, in the energy radiating process, energy is radiated onto the patterning substrate and the photocatalyst containing layer side substrate in the state that the latter substrate and the property variable layer are facing each other, thereby making it possible to easily manufacture a pattern formed structure having a property variable pattern a property of which is varied by action of the photocatalyst based on the irradiation with the energy. At this time, in the invention, the intensity of the energy radiated in the energy radiating process can be made smaller than that used in ordinary patterning; therefore, the photocatalyst can be efficiently excited so that the total light quantity can be made remarkably small. Accordingly, according to the invention, a pattern formed structure can be effectively manufactured.

In the invention, it is preferred that a light shielding part is formed on the base material of the patterning substrate, and the irradiation with the energy in the energy radiating process is performed from the side of the base material. In this case, the property of the property variable layer only inside the region in which the light shielding part is not formed can be varied without using any photomask or the like in the energy radiating process. Accordingly, the step of positioning a photomask or the like is unnecessary and thus a pattern formed structure can be manufactured more effectively. Furthermore, even if the energy radiated in the energy radiating process is scattered light in this case, the light can reach, without diffusing, the photocatalyst containing layer facing to the property variable layer. Accordingly, the scope for selection of the light source used in the energy radiating process can be made wide, thus it is advantageous.

In the present invention, it is preferred that the irradiation with the energy is performed from a fluorescent lamp which emits light having a wavelength in the range of 250 to 450 nm. This makes it possible to radiate the energy by use of a lamp which emits a low energy having a long wavelength so as to make an especial device or equipment unnecessary. The light having the above-mentioned wavelength has an advantage that the light produces no effect onto the human body.

In this case, it is preferred that the fluorescent lamp is a cold cathode type fluorescent lamp and is a lamp selected from a black light, a health lamp, and a germicidal lamp. Since these lamps can be rendered a line light source, energy can be radiated onto the patterning substrate having a large area at a time. No especial device is necessary for radiation of energy from these lamps and further they have a relatively long lifespan; accordingly, the use of these lamps is also preferred from the viewpoint of production costs.

The present invention also provides a method for manufacturing a functional element, comprising a functional portion forming process of forming a functional portion on the property variable pattern of the pattern formed structure manufactured by the method for manufacturing a pattern formed structure.

According to the invention, the property variable pattern in which the property is varied is formed on the pattern formed structure; therefore, a highly precise functional portion can easily be formed by using this property difference inside the property variable pattern.

The present invention also provides a method for manufacturing a color filter, wherein the functional portion forming process in the above-mentioned method for manufacturing a functional element is a colored layer forming process of forming a colored layer.

According to the invention, a highly precise colored layer can easily be formed by, for example, an ink-jetting method using, for instance, a wettability difference inside the property variable pattern.

The present invention also provides a method for manufacturing an electroconductive pattern in which the functional portion forming process in the above-mentioned method for manufacturing a functional element is a process of forming metallic wiring.

According to the invention, metallic wiring can easily be formed by, for example, an electric field jetting method using, for instance, a property difference inside the property variable pattern.

The present invention also provides a method for manufacturing an organic electroluminescent element in which the functional portion forming process in the above-mentioned method for manufacturing a functional element is a process of forming an organic electroluminescent (hereinafter abbreviated to "organic EL" as the case may be) layer.

According to the invention, an organic EL layer can be formed in a highly precise pattern form, using a property difference inside the property variable layer. Consequently, a high-quality organic EL element can be manufactured.

The present invention also provides a method for manufacturing a base material for biochip in which the functional portion forming process in the above-mentioned method for manufacturing a functional element is a process of forming a functional portion having adhesive property to a biological material.

According to the invention, this functional portion, which has adhesive property to a biological material, can be formed in a highly precise pattern form. Thus, the base material for biochip can be rendered a high-quality base material for biochip.

The present invention produces advantageous effects that the photocatalyst can be effectively excited so as to make it possible to manufacture a pattern formed structure having a property variable pattern with a property-varied surface based on a small total light quantity.

DESCRIPTION OF THE REFERRED EMBODIMENTS

The present invention relates to a method for manufacturing a pattern formed structure which has, in its surface, a pattern having different properties and can be used for various articles, a typical example of which is a color filter; a method for manufacturing a functional element using the pattern formed structure; and others. The following will describe each of them.

A. Method for Manufacturing a Pattern Formed Structure

First, the method for manufacturing a pattern formed structure of the present invention is described. The method is a method for manufacturing a pattern formed structure comprising: a patterning substrate preparing process of preparing a patterning substrate having a base material and a property variable layer which is formed on the base material and has a property variable by action of a photocatalyst based on irradiation with energy; and an energy radiating process of arranging a photocatalyst containing layer side substrate having a base body and a photocatalyst containing layer comprising at least the photocatalyst, and the patterning substrate so as to keep a given interval between the photocatalyst containing layer and the property variable layer, and then radiating energy onto the resultant at a given intensity, thereby forming a property variable pattern in which the property of the property variable layer is varied.

Figure 1A:
FIGS. 1A to 1C are process charts illustrating an example of the method for manufacturing a pattern formed structure of the invention.
Figure 1B:
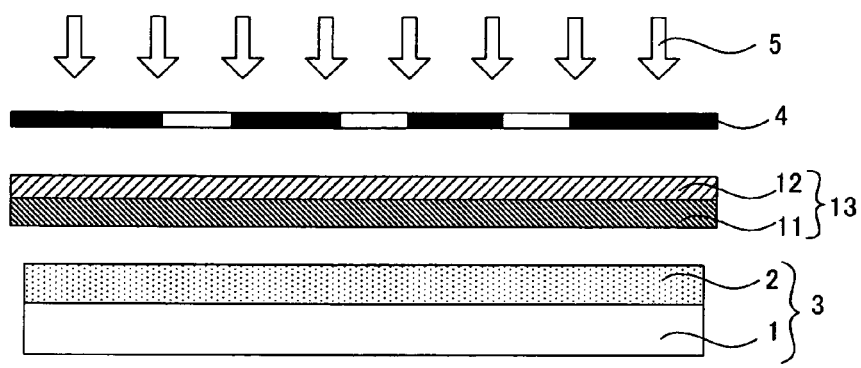
Figure 1C:
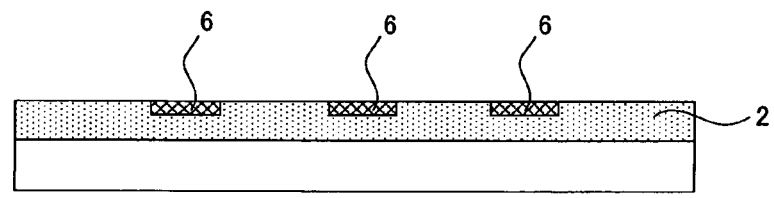

As shown in, for example, FIGS. 1A to 1C, the method for manufacturing a pattern formed structure of the present invention has a patterning substrate preparing process of preparing a patterning substrate 3 having a base material 1 and a property variable layer 2 formed on the base material (FIG. 1A); and a property variable pattern forming process of preparing a photocatalyst containing layer side substrate 13 having a photocatalyst containing layer 11 and a base body 12, arranging the substrate 13 and the patterning substrate 3 to keep a given interval between the photocatalyst containing layer 11 of the substrate 13 and the property variable layer 2, and then radiating energy 5 onto the resultant at a given intensity from a given direction through such as a photomask 4 (FIG. 1B), thereby forming a property variable pattern 6 in which the property of the property variable layer 2 is varied (FIG. 1C).

According to the invention, the patterning substrate prepared in the patterning substrate preparing process has the property variable layer; therefore, in the energy radiating process, energy is radiated onto the patterning substrate and the photocatalyst containing layer side substrate in the state that the property variable layer and the photocatalyst containing layer of the photocatalyst containing layer side substrate are facing each other, thereby making it possible to form a property variable pattern in which the property of the property variable layer is varied by action of the photocatalyst in the photocatalyst containing layer. It is therefore possible to form easily a pattern formed structure in which various functional portions, such as a colored layer of a color filter, can be formed by use of a property difference inside this property variable pattern.

In the energy radiating process in the present invention, energy radiated has a smaller intensity than energy radiated for ordinal patterning which uses a photocatalyst. In the case when the photocatalyst is irradiated with a low energy so as to be excited, the photocatalyst exhibits a higher quantum efficiency to make the total light quantity smaller than in the case when the photocatalyst is irradiated with a high energy so as to be excited. According to the invention, therefore, a pattern formed structure can be effectively manufactured based on a smaller energy amount.

The following will describe each of the processes in the method for manufacturing a pattern formed structure of the present invention in detail.

(1) Patterning Substrate Preparing Process

First, the patterning substrate preparing process in the present invention is described. The patterning substrate preparing process is not particularly limited if the process is a process of preparing a patterning substrate having a base material and the property variable layer which is formed on the base material and has a property variable by action of the photocatalyst based on irradiation with energy. The process can usually be rendered a process of forming the property variable layer on a base material. The following will describe the property variable layer and the base material used in the patterning substrate prepared in the present process.

(Property Variable Layer)

First, the property variable layer used in the patterning substrate prepared in the present process is described. The kind of the property variation of the property variable layer, and other natures of the layer are not particularly limited if the property variable layer is a layer the property of which is variable by action of a photocatalyst based on irradiation with energy. The layer may be, for example, a layer which is varied in adhesive property to a material by action of the photocatalyst or a layer which is varied in adhesive property to cells based on irradiation with energy.

In the invention, it is particularly preferred that the property variable layer is a wettability variable layer the contact angle of which with a liquid is lowered by action of a photocatalyst based on irradiation with energy, or a decomposition removing layer which is decomposed and removed by action of a photocatalyst based on irradiation with energy for the following reason: when the property variable layer is this wettability variable layer or decomposition removing layer, a functional portion can easily be formed on the pattern formed structure by use of the property variable pattern of the pattern formed structure. The following will describe the wettability variable layer and the decomposition removing layer.

a. Wettability Variable Layer

First, the wettability variable layer used in the pattern formed structure prepared in the patterning substrate preparing process is described. No especial limitation is imposed on the wettability variable layer if the layer is a layer the contact angle of which with a liquid is lowered by action of the photocatalyst excited by the energy radiated in the energy radiating process, which will be detailed later. When the property variable layer is the wettability variable layer in the invention, a highly precise functional portion can be formed on the property variable pattern of the pattern formed structure manufactured by the invention by, for example, ink-jetting.

The lyophilic region referred to herein is a region having a small contact angle with a liquid, and is a region having a good wettability to a functional portion forming coating solution for forming a functional portion on a manufactured pattern formed structure, for example, a colored layer forming coating solution for forming a colored layer when the functional element is, for instance, a color filter, or a metallic wiring forming coating solution when the functional element is metallic wiring. On the other hand, a liquid repellent region is a region having a large contact angle with a liquid, and is a region having a poor wettability to the above-mentioned functional portion forming coating solution.

In the present invention, a region about which the contact angle with a liquid is 1° or lower than that of an adjacent region is defined as a lyophilic region, and a region about which the contact angle with a liquid is 1° or higher than that of an adjacent region is defined as a liquid repellent region.

As for the wettability variable layer used in the present invention, in the region not irradiated with energy in the energy radiating process to be described later, that is, in the liquid repellent region, it is preferable to have the contact angle with a liquid having a surface tension of 40 mN/m is 10° or more, more preferably, the contact angle with a liquid having a surface tension of 30 mN/m is 10° or more, and even more preferably the contact angle with a liquid having a surface tension of 20 mN/m is 10° or more for the following reason: the region not irradiated with the energy is a region for which liquid repellency is required; therefore, in the case that the contact angle with the above-mentioned liquid is small, the liquid repellency is insufficient; and, for example, when a colored layer forming coating solution for forming a colored layer of a color filter is applied by an ink-jetting method or the like and hardened so as to form the colored layer, the colored layer forming coating solution may also adhere onto the liquid repellent region; it therefore becomes difficult to form a functional portion such as a colored layer, highly precisely.

As for the wettability variable layer, in the region irradiated with energy in the energy radiating process to be described later, that is, in the lyophilic region, preferably, the contact angle with a liquid having a surface tension of 40 mN/m is less than 9°, more preferably, the contact angle with a liquid having a surface tension of 50 mN/m is 10° or less, and even more preferably the contact angle with a liquid having a surface tension of 60 mN/m is 10° or less for the following reason: in the case that the contact angle with the liquid is high in the region irradiated with the energy, that is, in the lyophilic region, the lyophilic region also repels, for example, a colored layer forming coating solution for forming a colored layer of a color filter; and, for instance, when the colored layer forming coating solution is applied by an ink-jetting method, this solution is not sufficiently applied or spread; it therefore becomes difficult to form a functional portion such as a colored layer.

The contact angle with respect to a liquid here is obtained from the results or a graph of the results of measuring (30 seconds after of dropping liquid droplets from a micro syringe) the contact angle with respect to liquids having various surface tensions using a contact angle measuring device (CA-Z type manufactured by Kyowa Interface Science, Co., Ltd). Moreover, at the time of the measurement, as the liquids having the various surface tensions, wetting index standard solution manufactured by JUNSEI CHEMICAL CO., LTD. were used.

According to the wettability variable layer used in the present invention, the wettability variable layer may be formed such that a fluorine is contained, and furthermore, the fluorine content of the wettability variable layer surface is lowered at the time of directing an energy to the wettability variable layer according to the function of the photocatalyst compared with the state before the energy irradiation. Moreover, it may be formed including a decomposing substance to be decomposed by the function of the photocatalyst based on the energy irradiation, and thereby changing the wettability on the wettability variable layer.

For the wettability variable layer having such a characteristic, according to the pattern irradiation of the energy, a pattern having a part with a small fluorine content can be formed easily. Here, since the fluorine has an extremely low surface energy, the surface of a substance containing a large amount of a fluorine has a smaller critical surface tension. Therefore, the critical surface tension of a part with a small fluorine content is larger than the critical surface tension of the surface of a substance with a large fluorine content. That is, it denotes that the part with a small fluorine content becomes a lyophilic area compared with the part with a large fluorine content. Therefore, by forming a pattern comprising a part with a small fluorine content compared with the surface of the periphery, a pattern of a lyophilic area is formed in a liquid repellent area.

Accordingly, when such a wettability variable layer is used, a pattern of lyophilic regions can easily be formed inside liquid repellent regions by radiation of energy in a pattern form. Therefore, for example, when functional portions are formed on the pattern formed structure, the functional portions can easily be formed only in the lyophilic regions.

As to the fluorine content in the wettability variable layer containing a fluorine as mentioned above, the fluorine content in the lyophilic area having a low fluorine content formed by the energy irradiation is 10 or less based on the fluorine content in the area without the energy irradiation as 100, it is preferably 5 or less, and it is particularly preferably 1 or less.

According to the range, a large difference can be generated in terms of the lyophilic property in the energy irradiated part and the unirradiated part. Therefore, by forming for example a functional portion to such a wettability variable layer, the functional portion can be formed accurately only in the lyophilic area with the fluorine content lowered so that a functional element good in precision can be obtained. The lowering ratio is based on the weight.

As to the measurement of the fluorine content in the wettability variable layer, various methods commonly executed can be used, and it is not particularly limited as long as it is a method capable of measuring the fluorine amount quantitatively on the surface such as the X-ray Photoelectron Spectroscopy, the ESCA (it is also referred to as the Electron Spectroscopy for Chemical Analysis), the fluorescent X ray analysis method, and the mass spectrometry.

No especial limitation is imposed on the material used in the wettability variable layer if the material is a material which has a variable wettability variable layer property mentioned above, that is, wettability variable by the photocatalyst in the contacting photocatalyst containing layer by irradiation of energy and which has a main chain which is not easily deteriorated or decomposed by action of the photocatalyst. Examples thereof include organopolysiloxanes, such as (1) an organopolysiloxane which exhibits a large strength and can be obtained by hydrolyzing and polycondensing chloro or alkoxysilane by sol-gel reaction, and (2) an organopolysiloxane obtained by crosslinking a reactive silicone excellent in water repellency or oil repellency.

In the case (1), it is preferably an organopolysiloxane as a hydrolyzed condensation product or a co-hydrolyzed condensation product of one or two or more kinds of silicon compounds represented by the general formula:

(Here, Y is an alkyl group, a fluoroalkyl group, a vinyl group, an amino group, a phenyl group, or an epoxy group, and X is an alkoxyl group, an acetyl group or a halogen. n is an integer from 0 to 3). Here, the number of atoms of the group represented by Y is preferably in a range of 1 to 20. Moreover, the alkoxy group represented by X is preferably a methoxy group, an ethoxy group, a propoxy group, or a butoxy group.

Organopolysiloxanes containing fluoroalkyl groups can be in particular preferably used. For example, organopolysiloxanes as described in Japanese Patent Application Laid-Open (JP-A) No. 2003-195029 can be used.

Moreover, as the reactive silicone (2), compounds having a skeleton represented by the following general formula can be presented.

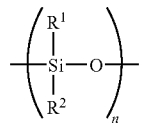

n is an integer of 2 or more, $R^1$, $R^2$ each are a substituted or non substituted alkyl, alkenyl, aryl or cyanoalkyl group having 1 to 10 carbon atoms, and 40% or less of the entirety based on the mole ratio is a vinyl, a phenyl, or a halogenated phenyl. Moreover, those having $R^1$, $R^2$ as a methyl group are preferable since the surface energy becomes the smallest, and it is preferable that a methyl group accounts for 60% or more based on the mole ratio. Moreover, at least one reactive group such as a hydroxyl group is provided in a molecular chain at the chain end or the side chain.

Furthermore, together with the above-mentioned organopolysiloxane, a stable organosilicon compound with no crosslinking reaction such as a dimethylpolysiloxane may be mixed.

As described above, in the invention, various materials such as organopolysiloxanes can be used in the wettability variable layer; it is effective for forming a pattern of wettability to incorporate fluorine into the wettability variable layer. It is therefore preferred to incorporate fluorine into a material which is not easily deteriorated or decomposed by action of the photocatalyst, specifically, incorporate fluorine into organopolysiloxane material, thereby forming a wettability variable layer.

It is allowable to incorporate, into the wettability variable layer in the invention, the same surfactant or additive as described in, e.g., JP-A-2003-195029 besides the above-mentioned materials.

The wettability variable layer can be formed by dispersing the above-mentioned components and optional additives into a solvent to prepare a coating solution, and then applying this coating solution onto abase material. As the solvent to be used, alcohol based organic solvents such as an ethanol and an isopropanol are preferable. The coating operation can be carried out by a known coating method such as spin coating, spray coating, dip coating, roll coating and bead coating. In the case an ultraviolet ray curable type component is contained, the wettability variable layer can be formed with an execution of a cure process by irradiating an ultraviolet ray.

b. Decomposition Removing Layer

The following will describe the decomposition removing layer used in the present invention. No especial limitation is imposed on the decomposition removing layer if the layer is a layer in which a portion irradiated with energy can be decomposed and removed by action of the photocatalyst in the photocatalyst containing layer.

Since the decomposition removing layer is decomposed or removed by action of the photocatalyst, it is possible to form a pattern composed of one or more portions having the decomposition removing layer and one or more portions having no decomposition removing layer, that is, a pattern having irregularities, without performing any developing process or washing process.

This decomposition removing layer is oxidized and decomposed by action of the photocatalyst on the basis of energy radiation, so as to be gasified or the like. Accordingly, the layer is removed without performing any especial post-treatment such as a developing or washing process. However, a washing process or the like may be performed in accordance with the material of the decomposition removing layer.

It is preferred that the decomposition removing layer used in the present invention has a higher contact angle with a liquid than the surface of the base material, which will be detailed later, as well as irregularities are formed in this layer. This makes it possible to decompose and remove the decomposition removing layer to render the region where the base material is exposed and the region where the decomposition removing layer remains a lyophilic region and a liquid repellant region, respectively, thereby forming various patterns.

In the case of using a difference in wettability between the lyophilic region, where the base material is exposed by the energy radiation, and the liquid repellent region, where the decomposition removing layer not irradiated with energy remains, to form, for example, a functional portion on the pattern formed structure, there is preferably formed a pattern composed of the lyophilic and liquid repellent regions having a difference of 1° or more, preferably 5° or more, in particular 10° or more in contact angle with a liquid having substantially the same surface tension as the functional portion forming coating solution for forming the functional portion has. This makes it possible to render the functional portion a highly precise functional portion.

In the present invention, preferably, the contact angle of the decomposition removing layer surface with a liquid having a surface tension of 40 mN/m is 10° or more, more preferably, the contact angle with a liquid having a surface tension of 30 mN/m is 10° or more, and even more preferably the contact angle with a liquid having a surface tension of 20 mN/m is 10° or more.

In this case, the base material, which will be detailed later, is preferably lyophilic. Specifically, the contact angle with a liquid having a surface tension of 40 mN/m is preferably 9° or less, more preferably 5° or less, and even more preferably 1° or less.

When the wettability of the decomposition removing layer and the base material is within the above-mentioned range, the region where the base material is exposed and the region where the decomposition removing layer remains can be rendered a lyophilic region and a liquid repellant region, respectively, thereby easily forming a highly precise pattern. The contact angle with a liquid, referred to herein, is a value measured by the above-mentioned method.

In this case, the base material, which will be detailed later, may be a base material subjected to surface treatment so as to have a lyophilic surface. An example of this surface treatment is lyophilic surface treatment with plasma using argon, water or the like. An example of a lyophilic layer to be formed on the base material is a silica film obtained by a sol-gel method of tetraethoxysilane. In the present invention, the portion where the base material is exposed is usually rendered a lyophilic region.

Specific examples of the film which can be used as the above-mentioned decomposition removing layer include fluorine-containing or hydrocarbon-based resin films having liquid repellency. The fluorine-containing or hydrocarbon-based resin is not limited to any especial kind and can be formed by dissolving such a resin into a solvent and then applying the solution into a film form by an ordinary film-forming method such as spin coating.

In the present invention, the decomposition removing layer having no defect can be formed by use of a functional film such as a self assembled monomolecular film, a Langmuir-Blodgett film, or an alternating adsorption film. Thus, it is preferred to use a method for forming such a film. The self assembled monomolecular film, the Langmuir-Blodgett film, or the alternating adsorption film may be the same as described in, e.g., JP-A No. 2003-195029. Thus, detailed description thereof is omitted herein.

(Base Material)

The following will describe the base material used in the present invention. The base material is not limited to any especial kind if the base material is a material on which the property variable layer can be formed. The base material is appropriately selected in accordance with such as the kind and use purpose of the pattern formed structure. The transparency and the flexibility thereof also are appropriately selected. When the property variable layer is a decomposition removing layer as described above, the surface of the base material may be subjected to surface treatment for making the surface lyophilic.

Examples of the base material used in the pattern formed structure include a resin-laminated plate having a paper base, a resin-laminated plate having a glass cloth base or a glass nonwoven cloth base, and ceramic and metallic plates.

(Patterning Substrate)

The following will describe the patterning substrate prepared in the present process. No limitation is imposed on the patterning substrate if the patterning substrate is a substrate having the above-mentioned base material and property variable layer. If necessary, the patterning substrate may appropriately have one or more different members.

Figure 6:
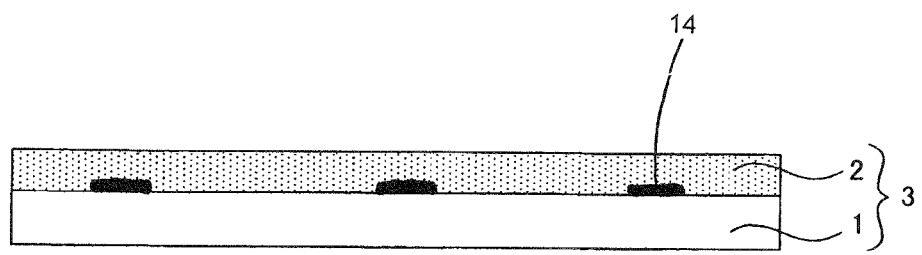
FIG. 6 is a schematic sectional view showing an example of a patterning substrate according to certain aspects of the present invention.

In the invention, and as can be seen in FIG. 6, it is in particular preferred that the base material (1) is transparent and a light shielding part (14) is formed on the base material. This makes it possible that when the property variable layer (2) and the photocatalyst containing layer, which contains a photocatalyst, are arranged so as to face each other and then energy is radiated onto the resultant from the base material side thereof in the energy radiating process, which will be detailed later, a property variable pattern is formed. In this case, no energy is radiated onto the photocatalyst containing layer inside the region where the light shielding part is formed, so that the photocatalyst inside this region is not excited. Accordingly, the property of the property variable layer only inside no light shielding part is formed can be varied; therefore, a property variable pattern can be formed in a pattern form without using any photomask or the like. For example, even if a scattered light source is used as the light source for energy radiated in the energy radiating process in this case, light therefrom can reach the photocatalyst containing layer without diffusing relatively. Accordingly, there is produced an advantage that the scope for the selection of light source used in the energy radiating process can be made wide.

No especial limitation is imposed on the light shielding parts if the parts are parts capable of shielding the radiated energy. The method used for forming the light shielding parts is appropriately selected in accordance with the power for shielding to the required energy and other factors.

For instance, a metal thin film that is made of chromium or the like and formed into a thickness of about 1000 to 2000 Å by a sputtering method, a vacuum deposition method or the like is formed and patterned to form a shielding portion. As the patterning method, an ordinary patterning method such as the sputtering can be used.

A method may be one by which a layer that contains light-shielding particles such as carbon particulates, metal oxides, inorganic pigments and organic pigments in a resin binder is formed in a pattern. As the resin binders that can be used, a polyimide resin, acrylic resin, epoxy resin, polyacrylamide, polyvinyl alcohol, gelatin, casein, cellulose and the like can be used singularly or in combination of two or more kinds, and furthermore a photosensitive resin and an O/W emulsion type resin composition such as emulsified reactive silicone can be used. A thickness of such the resinous light-shielding part can be set in the range of 0.5 to 10 μm. As a method of patterning such the resinous light-shielding part, methods such as a photolithography method and a printing method that are generally used can be used.

Moreover, in the present invention, the light shielding part may be formed by the thermal transfer method. According to the thermal transfer method for forming the light shielding part in general, a light shielding part is formed by disposing on a base material a thermal transfer sheet with a photo thermal conversion layer and a light shielding part transfer layer provided on one side of a transparent film base material, and directing an energy to the area for forming the light shielding part so as to transfer the light shielding part transfer layer onto the base material. The film thickness of the light shielding part to be formed by the thermal transfer method is in general 0.5 μm to 10.0 μm, and in particular about 0.8 μm to 5.0 μm.

The light shielding part to be transferred by the thermal transfer method in general comprises a light shielding material and a binding agent. As the light shielding material, inorganic particles of a carbon black, a titanium black, or the like can be used. The particle size of the light shielding material is preferably in a range of 0.01 μm to 1.0 μm, in particular, in a range of 0.03 μm to 0.3 μm.

Moreover, as to the binding agent, it is preferable that it has a resin composition having the thermoplastic property and the thermosetting property, and it is preferable that it has a thermosetting functional group, a resin material having a softening point in a range of 50 to 150° C., in particular, 60 to 120° C., and a hardening agent, or the like. As such a material, specifically, an epoxy compound having two or more epoxy groups in one molecule, a combination of an epoxy resin and a potential hardening agent thereof, or the like can be presented. Moreover, as the potential hardening agent for an epoxy resin, a hardening agent not showing the reactivity with an epoxy resin up to a certain temperature and having the molecular structure change to show the reactivity with the epoxy resin at the time it reaches at the activating temperature by heating can be used. Specifically, a neutral salt or complex of an acidic or basic compound having the reactivity with an epoxy resin, a block compound, a high melting point substance, and a micro capsule contained substance can be presented. Moreover, in the light shielding part, in addition to the materials, a mold releasing agent, a bonding auxiliary agent, an antioxidant, a dispersing agent, or the like may be contained.

(2) Energy Radiating Process

The following will describe the energy radiating process in the invention. The energy radiating process is a process of preparing a photocatalyst containing layer side substrate having a base body and a photocatalyst containing layer comprising at least a photocatalyst, arranging the property variable layer of the patterning substrate prepared in the patterning substrate preparing process and the photocatalyst containing layer so as to face to each other, and then radiating energy onto the resultant at a given intensity from a given direction.

The following will describe each of the energy radiated in the present process, the method for radiating the energy, the photocatalyst containing layer used in the process, and the light radiating device used in the process.

(Energy and the Method for Radiating the Energy)

First, the energy radiated in the present process, and the method for radiating the energy are described. The kind of the energy radiated in the present process and other natures of the energy are not particularly limited if the energy has a given intensity. Specifically, the intensity of the energy radiated in the invention is preferably from 0.1 to 10 mW/cm$^2$, more preferably from 0.1 to 8 mW/cm$^2$, and even more preferably from 0.1 to 3 mW/cm$^2$. This energy intensity is lower than that of energy used ordinarily for patterning using the action of a photocatalyst based on irradiation with this energy. The use of this energy intensity makes it possible to excite the photocatalyst efficiently; in this case, therefore, the total light quantity can be made remarkably smaller than in the case of using the energy intensity used for ordinary patterning, thereby manufacturing a pattern formed structure effectively. If the energy intensity is larger than the value, the photocatalytic reaction is poor and the efficiency is deteriorated. If the energy intensity is lower than the value, similarly the the photocatalytic reaction is poor and the efficiency is deteriorated.

In the present invention, the kind and so on of the energy are not particularly limited if the energy can be radiated at the above-mentioned intensity. The radiation intensity from various light sources used for ordinary patterning, such as a mercury lamp, a metal halide lamp, a xenon lamp, and an excimer lamp, may be dropped into an intensity within the above-mentioned range.

In the present invention, the energy radiating process is performed using a fluorescent lamp which emits wavelengths preferably in the range of 250 to 450 nm, more preferably in the range of 280 to 430 nm, and even more preferably in the range of 300 to 380 nm. The lamp which emits wavelengths in this range can be rendered a line light source; accordingly, the lamp makes it possible to radiate energy onto a large area. Furthermore, the lamp is preferred from the viewpoint of production costs and production efficiency since any especial device is unnecessary. The light having the above-mentioned wavelength has an advantage that the light produces no effect onto the human body.

The fluorescent lamp which radiates light having the above-mentioned wavelengths is preferably a cold cathode type fluorescent lamp. The cold cathode type fluorescent lamp is in general longer in lifespan than any hot cathode type fluorescent lamp; thus, the former lamp makes it possible to work the radiating device at lower costs.

As the fluorescent lamp which radiates light having the above-mentioned wavelengths, a lamp called black light, germicidal lamp, or health lamp can be used. The black light is a lamp which can usually radiate light having wavelengths of about 300 to 430 nm. The health lamp is a lamp which can usually radiate light having wavelengths of about 280 to 320 nm. The germicidal lamp is a lamp which can usually radiate light having wavelengths of about 250 to 280 nm. The use of any one of these lamps makes the light radiating device small without using any especial unit and is also preferred from the viewpoint of costs.

The shape of the fluorescent lamp is not limited, and may be, for example, a spherical shape. The shape is preferably a straight-tube shape. This makes it possible to radiate light evenly along the width direction thereof, and perform patterning evenly. Since the length of such a fluorescent lamp can easily be adjusted, the lamp has an advantage that the light radiating device can be designed correspondingly to patterning substrates having various widths.

The energy radiation in the present process is performed to such a degree that the property of the property variable layer can be varied. The total light quantity therefore is usually from about 0.1 to 10 J/cm$^2$, preferably from about 0.4 to 4 J/cm$^2$. Since energy is radiated at the above-mentioned intensity in the invention, the property of the property variable layer can be varied even at such a small total light quantity.

In the invention, the energy radiation is performed in the state that the photocatalyst containing layer of the photocatalyst containing layer side substrate which will be detailed later and the property variable layer of the above-mentioned patterning substrate are arranged so as face to each other. The above-mentioned wording "are arranged" means that the above-mentioned two layers are arranged in the state that the action of the photocatalyst can substantially work to the surface of the property variable layer, and include not only the state that the two layers physically contact each other, but also the state that the two layers are arranged at a given interval. The interval is preferably 200 μm or less.

The above-mentioned interval in the invention is more preferably from 0.2 to 10 μm, even more preferably from 1 to 5 μm since the precision of the pattern to be obtained becomes very good and further the sensitivity of the photocatalyst also becomes high so as to make good the efficiency of the property variation of the property variable layer. This range of the interval is particularly effective for the property variable layer small in area, which makes it possible to control the interval with a high precision.

Meanwhile, in the case of radiating energy onto the property variable layer large in area, for example, 300 mm or more×300 mm or more in size, it is very difficult to keep a fine interval as described above between the photocatalyst containing layer side substrate and the property variable layer without contacting each other. Accordingly, when the property variable layer has a relatively large area, the interval is preferably from 10 to 100 μm, more preferably from 50 to 75 μm. The limitation of the interval into this range gives an advantageous effect of not causing problems based on a fall in patterning precision such as a problem that a blurred pattern is obtained, or other problems such as a problem that the sensitivity of the photocatalyst deteriorates so that the efficiency of the property variation also deteriorates, and an advantageous effect of not causing unevenness in the property variation on the property variable layer.

At the time of radiating energy onto the property variable layer having a relatively large area as described above from an energy radiating device, in a unit for positioning the photocatalyst containing layer side substrate and the property variable layer precisely inside this device, the interval therebetween is set preferably into the range of 10 to 200 μm, more preferably into the range of 25 to 75 μm. The setting of the interval value into this range makes it possible to arrange the photocatalyst containing layer side substrate and the property variable layer without causing a large drop in patterning precision or in sensitivity of the photocatalyst, and without bringing the photocatalyst containing layer side substrate and the property variable layer into contact with each other.

When the photocatalyst containing layer and the surface of the property variable layer are arranged at a given interval as described above, active oxygen species generated from oxygen and water by action of the photocatalyst can easily be released. In other words, if the interval between the photocatalyst containing layer and the property variable layer is made narrower than the above-mentioned range, the active oxygen species are not easily released, so as to make the rate for the property variation unfavorably small. If the two layers are arranged at an interval larger than the above-mentioned range, the generated active oxygen species do not reach the property variable layer easily. In this case also, the rate for the property variation unfavorably becomes small.

In the invention, it is sufficient that such an arrangement state is maintained at least only during the energy radiation.

The method for arranging the photocatalyst containing layer and the property variable layer to keep such a very small interval evenly therebetween is, for example, a method of using spacers. The use of the spacers in this way makes it possible to keep an even interval. In regions which the spacers contact, the action of the photocatalyst does not work onto the surface of the property variable layer; therefore, when the spacers are rendered spacers having a pattern similar to a given property variable pattern to be formed, the property variable pattern can be formed on the property variable layer. The use of the spacers makes it possible that the active oxygen species generated by action of the photocatalyst reach the surface of the property variable layer, without diffusing, at a high concentration. Accordingly, a highly precise property variable pattern can be effectively formed.

In the case of using the photocatalyst containing layer side substrate in which the photocatalyst containing layer is formed on a flexible base body such as a flexible resin film, it is difficult to keep an interval as described above. Thus, it is preferred to arrange the photocatalyst containing layer and the property variable layer to contact each other from the viewpoint of production efficiency and others.

In this case, it is preferred to radiate energy onto the photocatalyst containing layer while heating the layer since the sensitivity can be made high so that the property variable layer can be effectively decomposed and removed. Specifically, it is preferred to heat the photocatalyst containing layer at 30 to 80° C.

The direction in which the energy is radiated is appropriately selected in accordance with whether or not the patterning substrate has light shielding parts or whether or not the photocatalyst containing layer side substrate which will be detailed later has photocatalyst containing layer side light shielding parts, or other factors.

In other words, when photocatalyst containing layer side light shielding parts are formed on the photocatalyst containing layer side substrate which will be detailed later, it is necessary to radiate energy from the side of the photocatalyst containing layer side substrate. Furthermore, in this case, it is necessary that the photocatalyst containing layer side substrate is transparent for the radiated energy. When photocatalyst containing layer side light shielding parts are formed on the photocatalyst containing layer and further these light shielding parts are used to fulfill a function of spacers, as will be detailed later, the energy may be radiated from the side of the photocatalyst containing layer side substrate or from the side of the patterning substrate.

Meanwhile, when light shielding parts are formed on the patterning substrate, energy can be radiated from the side of the patterning substrate. In this case, it is necessary that the patterning substrate is transparent for the radiated energy.

When the photocatalyst containing layer which will be detailed later is formed into a pattern, energy may be radiated from any direction if the energy is radiated onto the portion where the photocatalyst containing layer and the property variable layer are facing each other as mentioned above.

When a photomask is used, energy is radiated from the side where the photomask is arranged. In this case, it is necessary that the substrate on which the photomask is arranged, that is, the photocatalyst containing layer side substrate or the patterning substrate is transparent.

When the above-mentioned energy radiation is finished, the photocatalyst containing layer side substrate is separated from the position where the substrate contacts the property variable layer. In this way, a property variable pattern 6 in which the property of the property variable layer 2 is varied is formed, as shown in FIG. 1C.

(Photocatalyst Containing Layer Side Substrate)

The following will describe the photocatalyst containing layer side substrate used in the present process. The photocatalyst containing layer side substrate is a member having a photocatalyst containing layer comprising a photocatalyst and a base body, and is usually a member in which the photocatalyst containing layer is formed on the base body. The photocatalyst containing layer side substrate may have, for example, photocatalyst containing layer side light shielding parts formed in a pattern form, or a primer layer. The following will describe each of the constituents of the photocatalyst containing layer side substrate.

a. Photocatalyst Containing Layer

First, the photocatalyst containing layer used in the photocatalyst containing layer side substrate is described. No especial limitation is imposed on the photocatalyst containing layer if the layer has a structure capable of varying the property of the adjacent property variable layer by action of the photocatalyst therein. The photocatalyst containing layer may be a film made of the photocatalyst and a binder, or may be a film made only of the photocatalyst. The property of the surface thereof may be lyophilic or liquid repellent.

Figure 2:
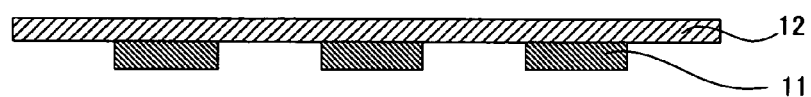
FIG. 2 is schematic sectional views showing an example of the photocatalyst containing layer side substrate used in the energy radiating process in the present invention.

The photocatalyst containing layer used in the invention may be a layer formed on the whole of a surface of the substrate 12, as shown in, e.g., FIGS. 1A to 1C, or may be a photocatalyst containing layer 11 formed in a pattern on a substrate 12, as shown in, e.g., FIG. 2.

When the photocatalyst containing layer is formed in a pattern form in this way, it is unnecessary to perform patterning radiation by use of a photomask or the like when energy is radiated in the state that the photocatalyst containing layer and the property variable layer are arranged to keep a given interval. By radiating energy onto the entire surface, a pattern in which the property of the property variable layer is varied can be formed. The method for patterning the photocatalyst containing layer is not particularly limited, and may be, for example, photolithography.

The property of only the property variable layer portion which actually faces the photocatalyst containing layer is varied; therefore, the direction in which energy is radiated may be any direction if the energy can be radiated onto the portion where the photocatalyst containing layer and the property variable layer face each other. Furthermore, there is produced an advantage that the radiated energy is not limited to energy composed of parallel components, such as parallel ray light.

As the photocatalyst used in the present invention, those known as photo semiconductors, such as a titanium dioxide ($TiO_2$), a zinc oxide (ZnO), a tin oxide ($SnO_2$), a strontium titanate ($SrTiO_3$), a tungsten oxide ($WO_3$), a bismuth oxide ($Bi_2O_3$), and an iron oxide ($Fe_2O_3$) can be presented, and one or two or more kinds as a mixture can be selected and used from them.

According to the present invention, in particular, a titanium dioxide can be used preferably since it has high band gap energy, it is chemically stable without the toxicity, and it can be obtained easily. There is an anatase type and a rutile type in the titanium dioxides, and either can be used in the present embodiment, however, the anatase type titanium dioxide is preferable. The anatase type titanium dioxide has a 380 nm or less excitation wavelength.

As the anatase type titanium dioxide, for example, a hydrochloric acid deflocculation type anatase type titania sol (STS-02 (average particle diameter 7 nm) manufactured by ISHIHARA SANGYO KAISHA, LTD., ST-K01 manufactured by ISHIHARA SANGYO KAISHA, LTD.), a nitric acid deflocculation type anatase type titania sol (TA-15 (average particle diameter 12 nm) manufactured by Nissan Chemical Industries, Ltd.), or the like can be presented.

The above-mentioned titanium oxide may be of a visible ray responsible type. The titanium oxide of this type is titanium oxide which can be also excited by visible ray energy. An example of the method for making titanium oxide into the visible ray responsible type is a method of subjecting titanium oxide to nitriding treatment.

By subjecting titanium oxide ($TiO_2$) to nitriding treatment, a new energy level is formed inside the band gap of titanium oxide so that the band gap becomes narrow. Although the exciting wavelength of titanium oxide is usually 380 nm, the nitrided titanium oxide can be also excited by visible rays, which have longer wavelengths than the exciting wavelength. According to this, visible ray wavelengths of energy radiated from various light sources can also be caused to contribute to the excitation of titanium oxide ($TiO_2$). Consequently, the sensitivity of titanium oxide can be made higher.

The nitriding treatment of titanium oxide, referred to in the invention, is treatment for substituting some parts of oxygen sites in crystal of titanium oxide ($TiO_2$) with nitrogen atoms, treatment for doping spaces between lattices of crystal of titanium oxide ($TiO_2$) with nitrogen atoms, treatment for arranging nitrogen atoms in boundaries in polycrystal clusters of titanium oxide ($TiO_2$), or the like.

The method for the nitriding treatment of titanium oxide ($TiO_2$) is not particularly limited. An example thereof is a method of subjecting fine particles of crystalline titanium oxide to heat treatment at 700° C. in the atmosphere of ammonia to dope the particles with nitrogen, and making the nitrogen-doped fine particles, an inorganic binder, a solvent and so on into a dispersion.

With a smaller particle diameter of the photocatalyst, the photocatalytic reaction can be generated effectively, and thus it is preferable. An average particle diameter of 50 nm or less is preferable, and use of a photocatalyst of 20 nm or less is particularly preferable.

As described above, the photocatalyst containing layer in the invention may be made only of the photocatalyst, or may be made of a mixture of the photocatalyst and a binder.

The photocatalyst containing layer made only of the photocatalyst causes an improvement in efficiency of the property variation of the property variable layer, so as to shorten the treatment time and give other advantages from the viewpoint of costs. The photocatalyst containing layer made of the photocatalyst and a binder has an advantage that the photocatalyst containing layer is easily formed.

The method for forming the photocatalyst containing layer consists of only the photocatalyst may be a method using a vacuum film-forming method such as sputtering, CVD or vacuum vapor deposition. According to the formation by the vacuum film-forming method, it is possible to form, as an even film, the photocatalyst containing layer which contains only the photocatalyst. In this way, the property on the property variable layer can be evenly varied. Because of this matter and the matter that the layer is made only of the photocatalyst, the property on the property variable layer can be more effectively varied in this case than in the case of using a binder also.

Another example of the method for forming the photocatalyst-containing layer made only of a photocatalyst, is the following method: in the case that the photocatalyst is, for example, titanium dioxide, amorphous titania is formed on the base material and next fired so as to phase-change the titania to crystalline titania. The amorphous titania used in this case can be obtained, for example, by hydrolysis or dehydration condensation of an inorganic salt of titanium, such as titanium tetrachloride or titanium sulfate, or hydrolysis or dehydration condensation of an organic titanium compound, such as tetraethoxytitanium, tetraisopropoxytitanium, tetra-n-propoxytitanium, tetrabutoxytitanium or tetramethoxytitanium, in the presence of an acid. Next, the resultant is fired at 400 to 500° C. so as to be denatured to anatase type titania, and fired at 600 to 700° C. so as to be denatured to rutile type titania.

In the case of using a binder, the binder is preferably a compound having such a high bond energy that the main skeleton thereof is not decomposed by photoexcitation of the photocatalyst, and organopolysiloxane can be cited as an example.

In the case of using, as the binder, an organopolysiloxane, the photocatalyst-containing layer can be formed by dispersing a photocatalyst, the organopolysiloxane as the binder, and optional other additives into a solvent to prepare a coating solution and then applying this coating solution onto a base material. As the solvent to be used, alcohol based organic solvents such as an ethanol and an isopropanol are preferable. The coating operation can be carried out by a known coating method such as spin coating, spray coating, dip coating, roll coating and bead coating. In the case an ultraviolet ray curable type component is contained as a binder, the photocatalyst-containing layer can be formed with an execution of a cure process by irradiating an ultraviolet ray.

An amorphous silica can be presented as the binder. The precursor of the amorphous silica is represented by the general formula: $SiX_4$. X is preferably a silicon compound such as a halogen, a methoxy group, an ethoxy group, an acetyl group, a silanol as a hydrolysis product thereof, or a polysiloxane having a 3,000 or less average molecular weight.

Specific example may be such as tetraethoxysilane, tetraisopropoxysilane, tetra-n-propoxysilane, tetrabutoxysilane or tetramethoxysilane. In this case, the photocatalyst containing layer can be formed by dispersing the amorphous silica precursor and particles of the photocatalyst homogeneously into a non-aqueous solvent, hydrolyzing the dispersion with water content in the air to form silanol on a base body, and dehydrating and polycondensing the silanol at room temperature. When the silanol is dehydrated and polycondensed at 100° C. or higher, the polymerization degree of the silanol increases so that the strength of the film surface can be improved. These binders may be used alone or in the form of a mixture of two or more thereof.

In the case of using the binder(s), the content by percentage of the photocatalyst in the photocatalyst containing layer may be from 5 to 60% by weight, and is preferably from 20 to 40% by weight. The thickness of the photocatalyst containing layer is preferably from 0.05 to 10 μm.

Besides the photocatalyst and the binder, a surfactant may be incorporated into the photocatalyst containing layer. Specifically, hydrocarbons of the respective series of NIKKOL BL, BC, BO, and BB manufactured by Nikko Chemicals Co., Ltd., and fluorine base or silicone base nonionic surfactants such as ZONYL FSN and FSO manufacture by Du Pont Kabushiki Kaisha, Surflon S-141 and 145 manufactured by ASAHI GLASS CO., LTD., Megaface F-141 and 144 manufactured by DAINIPPON INK AND CHEMICALS, Inc., FTERGENT F-200 and F251 manufactured by NEOS, UNIDYNE DS-401 and 402 manufactured by DAIKIN INDUSTRIES, Ltd., and Fluorad FC-170 and 176 manufactured by 3M can be cited, and cationic surfactants, anionic surfactants and amphoteric surfactants also can be used.

Other than the surfactants, oligomers and polymers such as polyvinyl alcohol, unsaturated polyester, acrylic resin, polyethylene, diallyl phthalate, ethylene propylene diene monomer, epoxy resin, phenol resin, polyurethane, melamine resin, polycarbonate, polyvinyl chloride, polyamide, polyimide, styrene-butadiene rubber, chloroprene rubber, polypropylene, polybutylene, polystyrene, polyvinyl acetate, polyester, polybutadiene, polybenzimidazole, polyacrylonitrile, epichlorohydrine, polysulfide, polyisoprene and the like can be included in the photocatalyst containing layer.

b. Base Body

The following will describe the base body used in the photocatalyst-containing layer side substrate. As shown in FIGS. 1A to 1C, in the invention, the photocatalyst-containing layer side substrate 13 has at least a base body 12, and a photocatalyst-containing layer 11 formed on this base body 12. In this case, the material which constitutes the used base body is appropriately selected in accordance with the direction of energy irradiation which will be detailed later, the matter as to whether or not transparency is necessary for the pattern formed structure to be yielded, or other factors.

The base body used in the invention may be a member having flexibility, such as a resin film, or may be a member having no flexibility, such as a glass plate. This is appropriately selected in accordance with the method for the energy irradiation.

An anchor layer may be formed on the base body in order to improve the adhesive property between the base body surface and the photocatalyst-containing layer. The anchor layer may be made of, for example, a silane-based or titanium-based coupling agent.

c. Photocatalyst Containing Layer Side Light Shielding Parts

The photocatalyst-containing layer side substrate used in the invention may be a photocatalyst-containing layer side substrate on which photocatalyst-containing layer side light-shielding parts may be formed into a pattern form. When the photocatalyst-containing layer side substrate having photocatalyst-containing layer side light-shielding parts is used in this way, it is unnecessary to use, at the time of irradiating energy, any photomask or to irradiate a laser ray for drawing irradiation. It is therefore unnecessary to position a photomask precisely onto the photocatalyst-containing layer side substrate. Consequently, it is unnecessary to use any complicated step or any expensive device for drawing irradiation, thereby producing an advantage for costs.

Such a photocatalyst-containing layer side substrate having photocatalyst-containing layer side light-shielding parts can be classified into the following two embodiments, depending on the position where the photocatalyst-containing layer light-shielding parts are formed.

Figure 3:
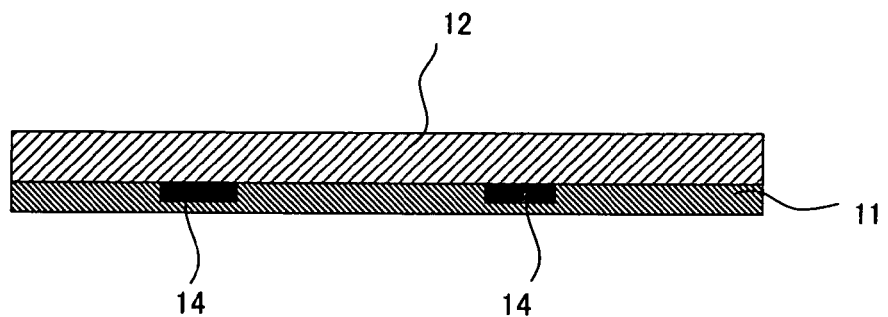
FIG. 3 is a schematic sectional view showing another example of the photocatalyst containing layer side substrate used in the energy radiating process in the present invention.

One of them is an embodiment, for example, as shown in FIG. 3, wherein photocatalyst-containing layer side light-shielding parts 14 are formed on a base body 12 and a photocatalyst-containing layer 11 is formed on the photocatalyst-containing layer side light-shielding parts 14. The other example is an embodiment, for example, as shown in FIG. 4, wherein a photocatalyst-containing layer 11 is formed on a base body 12 and photocatalyst-containing layer side light-shielding parts 14 are formed on the layer 11.

In any one of the embodiments, the effect of energy-scattering in the base body or the like can be made smaller than in the case of using a photomask since the photocatalyst-containing layer side light-shielding parts are arranged near the region where the photocatalyst-containing layer and the cell adhesive layer are arranged. Accordingly, irradiation of energy in a pattern form can be very precisely attained.

Figure 4:
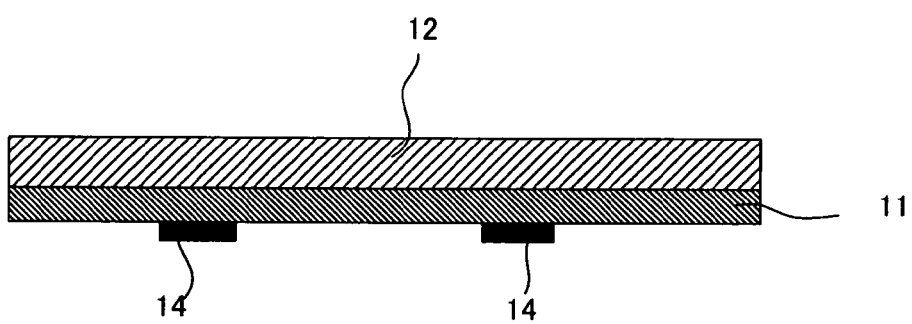
FIG. 4 is a schematic sectional view showing still another example of the photocatalyst containing layer side substrate used in the energy radiating process in the present invention.

In the invention, an embodiment wherein photocatalyst-containing layer side light-shielding parts 14 are formed on a photocatalyst-containing layer 12 as shown in FIG. 4 has an advantage that at the time of arranging the photocatalyst-containing layer and the property variable layer in a given position, the film thickness of the light-shielding parts 14 can be made consistent with the width of the interval between the two layers, thereby using the light-shielding parts 14 as a spacer for making the interval constant.

In other words, when the photocatalyst-containing layer and the property variable layer are arranged so as to be facing each other at a given interval, the photocatalyst-containing layer side light-shielding parts and the property variable layer can be made closely adhesive to each other, thereby making the dimension of the given interval precise. When the resultant in this state is irradiated with energy, property variable pattern can be formed with a good precision since no property in the property variable layer changes inside the region where the light-shielding parts and the property variable layer contact. At this time, the direction in which the energy is radiated is not limited to the direction from the front side of the base body, and may be, for example, the direction from a lateral face side of the base body.

The method for forming such photocatalyst-containing layer side light-shielding parts is not particularly limited, and may be appropriately selected in accordance with the property of the face where the light-shielding parts are to be formed, power for shielding required energy, and others.

For instance, a metal thin film that is made of chromium or the like and formed into a thickness of about 1000 to 2000 Å by a sputtering method, a vacuum deposition method or the like is formed and patterned to form a shielding portion. As the patterning method, an ordinary patterning method such as the sputtering can be used.

A method may be one by which a layer that contains light-shielding particles such as carbon particulates, metal oxides, inorganic pigments and organic pigments in a resin binder is formed in a pattern. As the resin binders that can be used, a polyimide resin, acrylic resin, epoxy resin, polyacrylamide, polyvinyl alcohol, gelatin, casein, cellulose and the like can be used singularly or in combination of two or more kinds, and furthermore a photosensitive resin and an O/W emulsion type resin composition such as emulsified reactive silicone can be used. A thickness of such the resinous light-shielding part can be set in the range of 0.5 to 10 μm. As a method of patterning such the resinous light-shielding part, methods such as a photolithography method and a printing method that are generally used can be used.

The above has described the two cases, where the photocatalyst containing layer side light shielding parts are positioned between the base body and the photocatalyst containing layer and are positioned on the surface of the photocatalyst containing layer. Besides, the photocatalyst containing layer side light shielding parts may be formed on the base body surface on which the photocatalyst containing layer is not formed. In this embodiment, for example, a photomask may be caused to adhere onto this surface to such a degree that the photomask can be put on and taken off. Thus, this case can be preferably used in the case of changing the property variable pattern for every small lot.

d. Primer Layer

The following will describe a primer layer used in the photocatalyst-containing layer side substrate of the invention. When photocatalyst-containing layer side light-shielding parts are formed into a pattern form on a base body and a photocatalyst-containing layer is formed thereon in the invention so as to prepare a photocatalyst-containing layer side substrate described above, a primer layer may be formed between the photocatalyst-containing layer side light-shielding parts and the photocatalyst-containing layer.

The effect and function of this primer layer are not necessarily clear, but would be as follows: the primer layer is formed between the photocatalyst-containing layer side light-shielding parts and the photocatalyst-containing layer, whereby the primer layer exhibits a function of preventing the diffusion of impurities from openings which are present between the light-shielding parts, the impurities being factors for blocking the property of the property variable layer from varying, in particular, residues generated when the photocatalyst-containing layer side light-shielding parts are patterned, or metal or metal ion impurities. Accordingly, the formation of the primer layer makes it possible that the processing of the property to vary with high sensitivity so as to yield a pattern in a high resolution.

The primer layer in the invention is a layer for preventing the effect of the photocatalyst from being affected by the impurities present inside not only the photocatalyst-containing layer side light-shielding parts but also the openings made between the light-shielding parts. It is therefore preferred to form the primer layer over the entire surface of the light-shielding parts plus the openings.

The primer layer in the invention is not limited to any special structure if the primer layer is formed not to bring the photocatalyst-containing layer side light-shielding parts and the photocatalyst-containing layer of the photocatalyst-containing layer side substrate into contact with each other.

A material that forms the primer layer, though not particularly restricted, is preferably an inorganic material that is not likely to be decomposed by action of the photocatalyst. Specifically, amorphous silica can be cited. When such amorphous silica is used, a precursor of the amorphous silica is preferably a silicon compound that is represented by a general formula, $SiX_4$, X being halogen, methoxy group, ethoxy group, acetyl group or the like, silanol that is a hydrolysate thereof, or polysiloxane having an average molecular weight of 3000 or less.

A film thickness of the primer layer is preferably in the range of 0.001 to 1 μm and particularly preferably in the range of 0.001 to 0.1 μm.

(Light Radiating Device)

The following will describe the light radiating device used in the present process. No especial limitation is imposed on the light radiating device if the device is a device capable of radiating energy at an intensity as described above. The device is appropriately selected in accordance with the kind of the above-mentioned light source for energy, and other factors.

Figure 5:
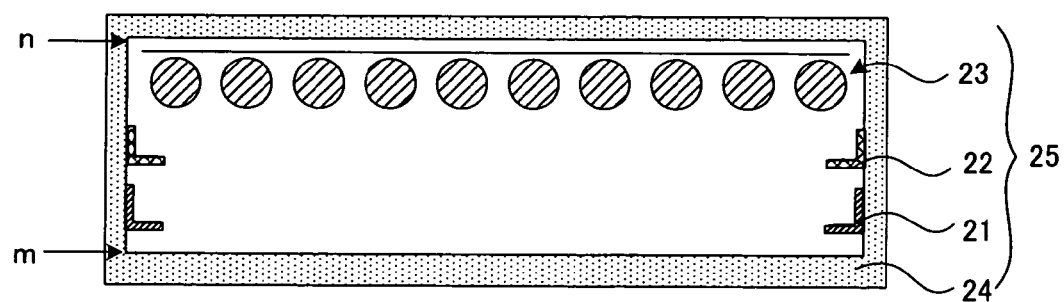
FIG. 5 is a schematic sectional view showing an example of the light radiating device used in the energy radiating process in the present invention.

As described above, in the invention, the light source used is preferably a fluorescent lamp which emits light having a wavelength in the range of 250 to 450 nm. The light radiating device using such a fluorescent lamp can be rendered a device, for example, as shown in FIG. 5, which has a light radiating unit 25 provided with a patterning substrate supporting section 21 for supporting the patterning substrate, a photocatalyst containing layer side substrate supporting section 22 for supporting the photocatalyst containing layer side substrate, an energy radiating section 23 for radiating the energy, and an outer frame 24 for supporting the energy radiating section. Each of the constituents of the light radiating device will be described hereinafter.

a. Energy Radiating Section

First, the energy radiating section in the light radiating device used in the process is described. Usually, the energy radiating section may be a section in which plural fluorescent lamps which emit a wavelength in the above-mentioned range are arranged. The number of the fluorescent lamps, the length thereof, and so on are appropriately selected in accordance with the kind and the size of the patterning substrate, and other factors.

The kind and so on of the fluorescent lamps, which is used in the energy radiating section and emits the above-mentioned wavelength, may be the same as described above. Thus, detailed description is omitted herein.

b. Patterning Substrate Supporting Section

The following will describe the patterning substrate supporting section used in the light radiating device. No especial limitation is imposed on the patterning substrate supporting section if the section is a section capable of supporting the patterning substrate which will be detailed later stably in the light radiating unit. The shape and so on of the patterning substrate supporting section are appropriately selected in accordance with the shape, the use purpose and so on of the patterning substrate. The supporting section may have, for example, a structure which supports the whole of the patterning substrate, or a structure which supports parts of the patterning substrate.

The material and so on of the patterning substrate supporting section are not especially limited if the section has such a strength that the patterning substrate can be supported. The section may be made of, for example, an inorganic material such as metallic or ceramic material, or an organic material such as plastic.

c. Photocatalyst Containing Layer Side Substrate Supporting Section

The following will describe the photocatalyst containing layer side substrate supporting section used in the light radiating device. No especial limitation is imposed on the photocatalyst containing layer side substrate supporting section if the section is a section capable of arranging the photocatalyst containing layer side substrate to keep a given distance from the patterning substrate. The section may be identical with the patterning substrate supporting section.

In the invention, any one of the patterning substrate supporting section and the photocatalyst containing layer side substrate supporting section may be arranged nearer to the energy radiating section. One out of the two is appropriately selected in accordance with the above-mentioned energy radiating direction.

d. Outer Frame Section

The following will describe the outer frame section used in the light radiating device. The outer frame section is a member for supporting the energy radiating section mentioned above. No especial limitation is imposed on the outer frame section if the section is a section capable of fixing the energy radiating section at a given position. In the light radiating device, the outer frame section may be formed separately from the patterning substrate supporting section or the photocatalyst containing layer side substrate supporting section, or the outer frame section may be rendered a member supporting the patterning substrate supporting section, the photocatalyst containing layer side substrate supporting section, and the energy radiating section.

In the light radiating device used in the invention, a plurality of the light radiating units may be stacked. In this case, the outer frame section is preferably an outer frame section which shields light radiated from each adjacent light radiating units where the units adjacent to each other. This makes it possible to pattern the pattern formed structure in the form of a part of a desired total pattern by means of each of the light radiating units without being affected by light radiated from adjacent light radiating units. In this case, the shape and so on of the outer frame section are not limited if the section is a section capable of shielding light between any adjacent light radiating units. As shown in, e.g., FIG. 5, the outer frame section may be a section in which light radiated from an energy radiating section 23 is shielded in side faces also of a light radiating unit 25. Alternatively, the outer frame section may be, for example, a section having a structure in which light is not shielded in side faces of a light radiating unit.

The size and shape of the outer frame section are appropriately selected in accordance with the area of the patterning substrate to be irradiated with light, and other factors.

The material which forms the outer frame section is not particularly limited. When a plurality of the light radiating units is stacked, the material is preferably a material capable of shielding energy radiated from the energy radiating section. Specific examples thereof include inorganic substances such as metallic material and ceramic material, and organic substances such as plastic.

When the outer frame section is formed between adjacent light radiating units, it is preferred that an inner wall (for example, a side m in FIG. 5) opposite to the energy radiating section across the patterning substrate supporting section is formed to absorb radiated energy. When the inner wall opposite to the energy radiating section reflects energy, the photocatalyst in the photocatalyst containing layer is excited by light radiated on the inner wall, so that undesired regions may be unfavorably patterned. The method for giving such energy absorptivity to the outer frame section inner wall on the side of the patterning substrate supporting section is, for example, a method of making the inner wall black, or a method of forming an energy absorbing layer on the inner wall. Also, an antireflective layer may be formed.

It is preferred that an outer frame section inner wall (for example, a side n in FIG. 5) on the side of the energy radiating section is formed to reflect radiated energy. This makes it possible to excite the photocatalyst by the energy reflected on the inner wall, thereby making the usability and efficiency of the energy better. The method for giving such energy reflectivity onto the outer frame section inner wall on the side of the energy radiating section is, for example, a method of making the inner wall into a mirror face, or a method of forming an antireflective layer on the inner wall.

e. Light Radiating Unit

The following will describe the light radiating unit in the light radiating device used in the invention. If the light radiating unit has the above-mentioned energy radiating unit, patterning substrate supporting section, photocatalyst containing layer side substrate supporting section and outer frame section, this unit is not particularly limited about the arrangement of the energy radiating section and the patterning substrate supporting section, and so on inside the light radiating unit. The unit is appropriately selected in accordance with the above-mentioned energy radiating direction, and other factors.

The light radiating unit is, for example, a unit in which the energy radiating unit is formed on its upper face and the patterning substrate supporting section and the photocatalyst containing layer side substrate supporting section are formed in its lower portion, or may be a unit in which the energy radiating section is formed on its lower face and the patterning substrate supporting section and the photocatalyst containing layer side substrate supporting section are formed in its upper portion. The light radiating unit may be a unit in which a plurality of the energy radiating sections, the patterning substrate supporting sections or the like are formed, or may be a unit in which the energy radiating unit is formed at its central portion and the patterning substrate supporting section and so on are formed above and under the section.

The light radiating unit may be, for example, a vertically-fixed unit.

If necessary, the light radiating unit in the invention may comprise therein various functional sections, such as a control section for controlling temperature, humidity and so on, besides the patterning substrate supporting section and the energy radiating section. The unit may have a mask supporting member for supporting a photomask, and other members between the patterning substrate supporting section or photocatalyst containing layer side substrate supporting section and the energy radiating section.

f. Light Radiating Device

The following will describe the light radiating device used in the present process. No especial limitation is imposed on the light radiating device if the device has the above-mentioned light radiating unit. The device may be, for example, a device made only of the light radiating unit, or a device in which a plurality of the light radiating units are stacked. When the light radiating units are stacked, the number of the units, which is selected in accordance with the size of the units and other factors, is usually from 2 to 20, preferably from 4 to 10. In the invention, the outer frame sections for any adjacent light radiating units may be integrated with each other.

(3) Others

The present invention may have one or more necessary processes, such as a process of preparing the photocatalyst containing layer side substrate, besides the patterning substrate preparing process and the energy radiating process.

B. Method for Manufacturing a Functional Element

The following will describe the method for manufacturing a functional element of the present invention. The method comprises a functional portion forming process of forming a functional portion on the property variable pattern of the pattern formed structure manufactured by the method described in the item "A. Method for manufacturing a pattern formed structure".

According to the invention, the property variable pattern, which has a varied pattern, is formed in the pattern formed structure; therefore, a property difference inside this property variable pattern is used to make it possible to perform easily the functional portion forming process, wherein a functional portion is formed.

The word "functional" means one or more out of various functions such as optical functions (such as light selective absorption, reflectivity, polarizability, light selective transparency, nonlinear optical property, luminescence such as fluorescence or phosphorescence, and photochromism); magnetic functions (such as hard magnetism, soft magnetism, non-magnetism, magnetic permeability); electric or electronic functions (such as electroconductivity, electric insulation, piezoelectricity, pyroelectricity and dielectricity); chemical functions (such as adsorption, desorption, catalytic property, water absorptivity, ion conductivity, redox property, electrochemical property, and electrochromism); mechanical functions (such as abrasion resistance); thermal functions (such as heat transfer property, adiathermancy, and infrared ray radiating property), and biological functions (such as living body adaptability, and antithrombotic property).

The functional portion forming coating solution used in the functional portion forming process in the invention is largely varied in accordance with the kind of the functional element to be manufactured, the method for forming the element, and other factors, as described above. The coating solution may be, for example, a composition not diluted with any solvent, such as an ultraviolet curable monomer, a liquid composition diluted with a solvent, or the like. It is particularly preferred that the viscosity of the functional portion forming coating solution is smaller since a pattern can be formed in a shorter time. In the case of a liquid composition diluted with a solvent, the viscosity thereof is raised or the surface tension thereof is changed by the volatilization of the solvent at the time of forming a pattern. It is therefore desired that the solvent has a low volatility.

The functional portion forming coating solution used in the invention may be a solution which is stuck and arranged onto the above-mentioned property variable pattern, thereby turning into a functional portion, or a solution which is arranged onto the property variable pattern and then subjected to treatment with a chemical agent, ultraviolet rays, heat or the like, thereby turning into a functional portion. In this case, it is preferred that the functional portion forming coating solution contains, as a binding agent therefore, a component curable by ultraviolet rays, heat, an electron beam, or the like since a functional portion can be rapidly formed by curing treatment.

The functional portion forming process in the invention is preferably performed by a coating method such as dip coating, roll coating, blade coating or spin coating, a nozzle jetting-out method such as a method using ink-jetting, electric field jetting or a dispenser, or some other method. The use of the method makes it possible to form a functional portion evenly and highly precisely.

Of various methods of the present invention for manufacturing the functional element, preferred are a method for manufacturing a color filter in which its functional portion is a colored layer, a method for manufacturing an electroconductive pattern in which its functional portion is metallic wiring, a method for manufacturing a base material for biochip in which its functional portion has adhesive property to a biological material, and a method for manufacturing an organic EL element in which its functional portion is an organic EL layer. This is because the functional portions of these functional elements can easily be formed using a property difference inside the above-mentioned pattern formed structure.

C. Method for Manufacturing a Color Filter

The method for manufacturing a color filter of the invention will be described hereinafter. The method is a method in which the functional portion forming process in the above-mentioned method for manufacturing a functional element is a process of forming a colored layer.

According to the invention, in the case that the property variable layer in the pattern formed structure is, for example, a wettability variable layer having a wettability-variable surface, a wettability variable pattern having varied wettability is formed on the layer. Accordingly, using a wettability difference inside the surface, a colored layer can easily be formed by ink-jetting or the like. Thus, a color filter having a highly precise colored layer can be manufactured.

Such a colored layer is usually formed in three colors of red (R), green (G) and blue (B). The form of the colored pattern in the colored layer can be rendered a known form, such as a stripe form, a mosaic form, a triangular form, a four-pixel arrangement form. The colored area of the colored layer can be set at will.

The method for forming this colored layer is not particularly limited in the invention. Examples thereof include a coating method of applying a known colored layer forming coating solution by a known method such as spray coating, dip coating, roll coating or bead coating; and a vacuum thin-film forming method. In the invention, it is preferred to form the colored layer by ink-jetting since this method makes it possible that the colored layer is highly precisely formed onto the property variable pattern.

The colored layer forming coating solution used for the formation of such a colored layer, and so on may be the same as used in a colored layer in an ordinary color filter. Thus, detailed description thereof is omitted herein.

D. Method for Manufacturing an Electroconductive Pattern

The following will describe a method for manufacturing an electroconductive pattern of the invention. The method is a method in which the functional portion forming process in the above-mentioned method for manufacturing a functional element is a process of forming metallic wiring.

According to the invention, an electroconductive pattern in which highly precise metallic wiring is formed can be manufactured by applying a metallic paste or the like by, for example, an electric field jetting method using a property difference inside the above-mentioned property variable pattern.

In the invention, the metallic wiring is formed on the property variable layer; thus, the electric resistance of the property variable layer is set preferably into the range of $1 \times 10^8$ to $1 \times 10^{18}$ Ω·cm, more preferably into the range of $1 \times 10^{12}$ to $1 \times 10^{18}$ Ω·cm. This makes it possible to form an excellent electroconductive pattern.

The material for each of the members used for the method for manufacturing an electroconductive pattern of the invention, the method for forming each of the members, and so on may be the same as about ordinary electroconductive patterns. Thus, description thereof is omitted herein.

E. Method for Manufacturing an Organic EL Element

The following will describe a method for manufacturing an organic EL element of the invention. The method is a method in which the functional portion forming process in the above-mentioned method for manufacturing a functional element is a process of forming an organic EL layer.

According to the invention, using a property difference inside the above-mentioned property variable pattern, an organic EL layer can easily applied onto a specific area and so on, thereby making it possible to manufacture an organic element in which a highly precise organic EL layer is formed.

In the invention, it is particularly preferred that the above-mentioned property variable layer contains therein an electroconductive material. This makes it possible that even if the property variable layer is formed on the base material having on the surface thereof, for example, a first electrode layer, holes or the like permeate through this property variable layer. Accordingly, electric conduction can be attained between the first electrode layer and the organic EL layer made by use of the property variable pattern of these layers. The organic EL element according to the invention can be yielded, for example, by forming a second electrode layer on this organic EL layer.

The material for each of the members used for the method for manufacturing an organic EL pattern of the invention, the method for forming each of the members, and so on may be the same as about ordinary organic EL elements. Thus, description thereof is omitted herein.

F. Method for Manufacturing a Base Material for Biochip

The following will describe the method for manufacturing a base material for biochip of the invention. The method is a method in which the functional portion forming process in the above-mentioned method for manufacturing a functional element is a process of forming a functional portion having adhesive property to a biological material. The functional portion forming process in the invention can be rendered, for example, a process of causing a material having adhesive property to a biological material to adhere onto the above-mentioned property variable pattern. This makes it possible to prepare a base material for biochip which has adhesive property to the biological material in a pattern form.

When the biological material is immobilized onto this base material for biochip, a biochip can be obtained. On the surface of this biochip, the above-mentioned functional thin film works as an immobilizing layer. In the case that a biological material such as DNA or a protein is immobilized onto this layer, the resultant can be used for various articles.

To such a biological material immobilizing technique can be applied immobilizing techniques which have been actively researched in the development of bioreactors in which an enzyme is immobilized onto an insoluble carrier. The content of the techniques are detailed in, for example, "Immobilized Enzyme" edited by Ichiro Chihata and published by Kodansha Scientific in 1975, and reference documents described therein.

In some cases, an electrical reading method is used for biochips. In such cases, it is necessary to form electrodes on the surface of the above-mentioned base material for biochip. The electrodes may be formed by the same method as described about the above-mentioned method for manufacturing an electroconductive pattern, or may be formed by an ordinary photoresist method or the like.

In the invention, it is allowable to use a molecule having a functional group protected by a photosensitive protecting group in the property variable layer, de-protect the functional group by action of a photocatalyst based on irradiation with energy so as to form a pattern having cell adhesive property, and cause cells to adhere in the form of this pattern onto the layer, thereby manufacturing a biochip.

The material for each of the members used for the method for manufacturing a base material for biochip of the invention, the method for forming each of the members, and so on may be the same as about ordinary base materials for biochip. Thus, description thereof is omitted herein.

The present invention is not limited to the embodiments. The embodiments are merely examples, and any one having the substantially same configuration as the technological idea disclosed in the claims of the present invention and the same effects is included in the technological scope of the present invention.

EXAMPLES

Hereinafter, the present invention will be explained in further details with reference to the examples.

Example

Formation of a Patterning Substrate

First, 1.5 g of a fluoroalkylsilane (trade name: TSL 8233, manufactured by GE Toshiba Silicones), 5.0 g of tetramethoxysilane (trade name: TSL 8114, manufactured by GE Toshiba Silicones) and 2.5 g of 0.01-N hydrochloric acid were stirred at room temperature for 24 hours to prepare a liquid repellency giving agent.

This agent was diluted 20 times with isopropyl alcohol to prepare a property variable layer forming composition. The property variable layer forming composition was applied onto a glass substrate (trade name: NA-35, manufactured by NH Techno Glass Corp.) by spin coating, so as to form a patterning substrate.

<Formation of a Photocatalyst Containing Layer Side Substrate>

Titania sol (trade: STS-01, manufactured by ISHIHARA SANGYO KAISHYA, LTD.) was diluted with a mixed solution of water and isopropanol (ratio by weight=1:1) to give a $TiO_2$ concentration of 0.5% by weight, thereby preparing a photocatalyst containing layer forming composition.

The photocatalyst containing layer forming composition was applied onto a quartz glass substrate on which a black light shielding layer made of chromium was formed into a line and space form having a width of 40 μm and a pitch of 150 μm by spin coating, and then the resultant was fired at 200° C. for 15 minutes to form a photocatalyst containing layer side substrate.

<Light Exposure>

The property variable layer of the patterning substrate and the photocatalyst containing layer of the photocatalyst containing layer side substrate were arranged to have an interval of 10 μm therebetween. Light exposure was performed by radiating energy from a black light (trade name: FL-40S-BLB, manufactured by TOSHIBA LIGHTING & TECHNOLOGY CORPORATION.) onto the patterning substrate and the photocatalyst containing layer side substrate from the side of the latter substrate. The luminance of the black light was measured with a spectroradiometer (trade name: USR 40, manufactured by USHIO INC). As a result, the luminance was 1.5 mW/cm$^2$, and the total exposure quantity was 1.8 J/cm$^2$.

<Formation of a Color Filter>

Next, an ink-jetting device of a piezoelectric driving type was used to apply a UV curable polyfunctional acrylate monomer ink (coloring ink), in each color of R, G and B, containing 5 parts by weight of a pigment, 20 parts by weight of a solvent, 5 parts by weight of a polymerization initiator and 70 parts by weight of a UV curable resin onto a part where the property was varied of the above-mentioned patterning substrate. The resultant was subjected to UV treatment to cure the resins, thereby forming a pixel portion. In this way, a color filter was formed. About each of the red, green and blue inks, polyethylene glycol monomethylethyl acetate was used as the solvent, an Irgacure (transliteration) 369 (trade name) (manufactured by Ciba Specialty Chemicals) was used as the polymerization initiator, and DPHA (dipentaerythritol hexaacrylate) (manufactured by NIPPON KAYAKU CO., LTD.) was used as the UV curable resin. The following were used as the pigments in the red ink, the green ink, and the blue ink: C. I. Pigment Red 177, C. I. Pigment green 36, and C. I. Pigment Blue 15 & C. I. Pigment Violet 23, respectively.

Comparative Example 1

A color filter was formed in the same way as in Example 1 except that light exposure was performed by radiating energy from a super high mercury lamp onto photocatalyst-containing layer side substrate and a patterning substrate formed in the same way as in Example 1. At this time, the illuminance of the super high mercury lamp was measured in the same way as in Example 1. As a result, the illuminance was 200 mW/cm$^2$. The time for the light exposure was adjusted to set the total exposure quantity to 1.8 J/cm$^2$.

Comparative Example 2

A color filter was formed in the same way as in Comparative Example 1 except that the total light quantity was set to 10 J/cm$^2$.

[Evaluation of the Color Filters]

About each of the color filters formed in Example, and Comparative Examples 1 and 2, the relationship between the external appearance thereof and the total exposure quantity is shown in Table 1. In Comparative Examples 1 and 2 respectively, the total exposure quantity was small and the property of the property variable layer was not able to be satisfactorily varied so that white spots were generated in the colored layer. However, according to the present invention, a good color filter having no white spots was able to be produced even at a radiated energy amount of 1/10 or less of the radiated energy amount in Comparative Example 1.

TABLE 1

|  | Example | Comparative Example 1 | Comparative Example 2 |
|---|---|---|---|
| Total exposure quantity (J/cm$^2$) | 1.8 | 1.8 | 10 |
| External appearance results | Good | White spots | White spots |

What is claimed is:

1. A method for manufacturing a pattern formed structure, comprising:

a patterning substrate preparing process of preparing a patterning substrate having a transparent base material, a property variable layer which is formed on the base material and has a property variable by an action of a photocatalyst based on an irradiation with an energy, and a light shielding part formed on the base material, and an energy radiating process of arranging a photocatalyst containing layer side substrate having a base body and a photocatalyst containing layer comprising at least the photocatalyst, and the patterning substrate so as to keep a given interval between the photocatalyst containing layer and the property variable layer, and then radiating the energy onto the photocatalyst containing layer from a side of the patterning substrate at an intensity of 0.1 to 10 mW/cm$^2$, and a total light quantity of 0.1 to 10 J/cm$^2$, thereby forming by action of the photocatalyst contained in the photocatalyst containing layer a property variable pattern in which the property of the property variable layer is varied.

2. The method for manufacturing a pattern formed structure according to claim 1, wherein the irradiation with the energy is performed by means of a fluorescent lamp which emits light having a wavelength of 250 to 450 nm.

3. The method for manufacturing a pattern formed structure according to claim 2, wherein the fluorescent lamp is a cold cathode type fluorescent lamp and is a lamp selected from a black light, a health lamp, and a germicidal lamp.

4. A method for manufacturing a functional element, comprising a functional portion forming process of forming a functional portion on the property variable pattern of a pattern formed structure manufactured by the method for manufacturing a pattern formed structure according to claim 3.

5. A method for manufacturing a functional element, comprising a functional portion forming process of forming a functional portion on the property variable pattern of a pattern formed structure manufactured by the method for manufacturing a pattern formed structure according to claim 2.

6. The method for manufacturing a pattern formed structure according to claim 1, wherein the fluorescent lamp is a cold cathode type fluorescent lamp and is a lamp selected from a black light, a health lamp, and a germicidal lamp.

7. A method for manufacturing a functional element, comprising a functional portion forming process of forming a functional portion on the property variable pattern of a pattern formed structure manufactured by the method for manufacturing a pattern formed structure according to claim 6.

8. A method for manufacturing a functional element, comprising a functional portion forming process of forming a functional portion on the property variable pattern of a pattern formed structure manufactured by the method for manufacturing a pattern formed structure according to claim 1.

9. A method for manufacturing a color filter, wherein the functional portion forming process in the method for manufacturing a functional element according to claim 8 is a colored layer forming process of forming a colored layer.

10. A method for manufacturing an electroconductive pattern, wherein the functional portion forming process in the method for manufacturing a functional element according to claim 8 is a process of forming a metallic wiring.

11. A method for manufacturing an organic electroluminescent element, wherein the functional portion forming process in the method for manufacturing a functional element according to claim 8 is a process of forming an organic electroluminescent layer.

12. A method for manufacturing a base material for biochip, wherein the functional portion forming process in the method for manufacturing a functional element according to claim 8 is a process of forming the functional portion having an adhesive property to a biological material.

13. The method for manufacturing a pattern formed structure according to claim 1, wherein the energy is radiated to the photocatalyst containing layer at an intensity of 0.1 to 3 mW/cm$^2$.

14. The method for manufacturing a pattern formed structure according to claim 1, wherein the energy is radiated to the photocatalyst containing layer at an intensity of 0.1 to 1.5 mW/cm$^2$.

* * * * *